(12) United States Patent
Zhang et al.

(10) Patent No.: US 11,632,876 B2
(45) Date of Patent: Apr. 18, 2023

(54) ELECTRONIC DEVICE

(71) Applicant: BEIJING XIAOMI MOBILE SOFTWARE CO., LTD., Beijing (CN)

(72) Inventors: Bo Zhang, Beijing (CN); Duzi Huang, Beijing (CN); Mingyan Liu, Beijing (CN); Kailiang Zhao, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/364,535

(22) Filed: Jun. 30, 2021

(65) Prior Publication Data

US 2022/0312633 A1 Sep. 29, 2022

(30) Foreign Application Priority Data

Mar. 29, 2021 (CN) .......................... 202110336531.8

(51) Int. Cl.
*H05K 7/20* (2006.01)
*G06F 1/20* (2006.01)

(52) U.S. Cl.
CPC ......... *H05K 7/20154* (2013.01); *G06F 1/203* (2013.01); *G06F 2200/201* (2013.01)

(58) Field of Classification Search
CPC ....... H01L 23/467; H01L 35/30; H01L 23/40; H01L 2924/181; H01L 25/0657; G06F 1/20; G06F 1/203; G06F 2200/201; G06F 1/181; G06F 1/183; G06F 1/16; G06F 1/206; H05K 7/20; H05K 7/20409; H05K 7/20145; H05K 7/2039; H05K 7/20154; H05K 7/20909; H05K 7/20172; H05K 7/20418; H05K 1/0203; H05K 7/20181; H05K 7/20818; H05K 7/20736; H05K 7/20854; H05K 7/20572; H05K 2201/066;

(Continued)

(56) References Cited

U.S. PATENT DOCUMENTS 9,007,764 B2 * 4/2015 Fujii .................. H05K 7/20145
361/679.48
9,405,335 B1 * 8/2016 Boilard ..................... G06F 1/20
(Continued)

FOREIGN PATENT DOCUMENTS

DE 202016102879 U1 7/2016

OTHER PUBLICATIONS

Supplementary European Search Report in the European application No. 21182117.8, dated Dec. 16, 2021, (8p).

*Primary Examiner* — Michael A Matey
(74) *Attorney, Agent, or Firm* — Arch & Lake LLP

(57) ABSTRACT

An electronic device is provided. The electronic device includes a rear cover including an air inlet and an air outlet; a middle frame which is assembled with the rear cover to define a containing cavity in communication with the air inlet and the air outlet; a heat source arranged in the containing cavity; a heat transfer assembly arranged on a side of the middle frame facing towards the rear cover, and including first and a second ends; and a fan arranged opposite to the second end in the containing cavity. The first end and the heat source are stacked in a thickness direction of the electronic device. The heat transfer assembly is configured to transfer heat of the heat source to the second end. The fan draws air flow through the air inlet and discharges the air flow through the air outlet.

18 Claims, 3 Drawing Sheets

(58) Field of Classification Search
CPC .......... H05K 5/04; H05K 7/202; H05K 7/207; H05K 1/144; H05K 2201/09072; H05K 7/20563; H05K 1/0272; H05K 1/0201; H05K 7/1427
See application file for complete search history.

(56) References Cited

U.S. PATENT DOCUMENTS

| | | | |
|---|---|---|---|
| 9,622,390 B2* | 4/2017 | Hwang | H05K 7/20909 |
| 10,423,200 B1 | 9/2019 | North et al. | |
| 10,869,384 B2* | 12/2020 | Chen | H05K 1/0209 |
| 2002/0006027 A1* | 1/2002 | Rodriguez | H05K 7/20909 |
| | | | 361/688 |
| 2002/0067595 A1* | 6/2002 | Ogawa | G06F 1/20 |
| | | | 361/679.48 |
| 2006/0005549 A1 | 1/2006 | Ishinabe et al. | |
| 2011/0108250 A1* | 5/2011 | Horng | H05K 7/20163 |
| | | | 165/121 |
| 2011/0310557 A1* | 12/2011 | Ooe | G06F 1/20 |
| | | | 361/692 |
| 2012/0255713 A1* | 10/2012 | Horng | F04D 17/04 |
| | | | 165/121 |
| 2013/0145612 A1* | 6/2013 | Busch | G06F 1/182 |
| | | | 29/601 |
| 2013/0168058 A1* | 7/2013 | Chamseddine | F28D 7/0075 |
| | | | 165/104.26 |
| 2014/0085818 A1* | 3/2014 | Lee | H05K 5/0213 |
| | | | 29/592.1 |
| 2019/0324507 A1* | 10/2019 | Carbone | H05K 7/20336 |
| 2020/0008317 A1* | 1/2020 | Pedoeem | H05K 7/20563 |
| 2020/0146178 A1* | 5/2020 | Horng | H05K 5/0213 |
| 2021/0173456 A1* | 6/2021 | Kulkarni | H05K 7/20145 |
| 2021/0185852 A1* | 6/2021 | Yang | G06F 1/203 |

* cited by examiner

ELECTRONIC DEVICE

CROSS-REFERENCE TO RELATED APPLICATION

This application is based upon and claims priority to Chinese Patent Application No. 202110336531.8, filed on Mar. 29, 2021, the entire content of which is incorporated herein by reference for all purposes.

TECHNICAL FIELD

The present disclosure relates to the technical field of terminals, and particularly to electronic devices.

BACKGROUND

With rapid development of electronic techniques, the function of mobile terminal device such as mobile phones are growing more powerful, which causes increasing power consumption. For example, when a user plays a game or watches a video on the mobile terminal device, power consumption is increased and heat generated by a terminal is also increased since the mobile terminal needs to run large programs. The user may feel hot sense when holding the mobile terminal and feel uncomfortable. In addition, the safety performance of electronic device is further affected to a certain extent by the heat.

SUMMARY

The present disclosure provides electronic device to solve the defects in related technologies.

An example of the present disclosure provides electronic device, including: a rear cover including an air inlet and an air outlet; a middle frame assembled with the rear cover to define a containing cavity, the containing cavity is in communication with the air inlet and the air outlet; a heat source disposed in the containing cavity; a heat transfer assembly, disposed on a side of the middle frame facing towards the rear cover, and including a first end and a second end, the first end and the heat source component are stacked in a thickness direction of the electronic device, and the heat transfer assembly is configured to transfer heat of the heat source component to the second end; and a fan, disposed opposite to the second end in the containing cavity, and is configured to draw an air flow through the air inlet and discharge the air flow through the air outlet.

It should be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate examples consistent with the disclosure and, together with the specification, serve to explain the principles of the disclosure.

DETAILED DESCRIPTION

Reference will now be made in detail to exemplary examples, examples of which are illustrated in the accompanying drawings. The following description refers to the accompanying drawings in which the same numbers in different drawings represent the same or similar elements unless otherwise represented. The implementations set forth in the following description of exemplary examples do not represent all implementations consistent with the present disclosure. Instead, they are merely examples of devices and methods consistent with aspects related to the disclosure as recited in the appended claims.

The terms used in the disclosure are for the purpose of describing particular examples only, and are not intended to limit the disclosure. "A/an", "the" and "this" in a singular form in the disclosure and the appended claims are also intended to include a plural form, unless other meanings are clearly denoted throughout the disclosure. It should also be understood that term "and/or" used in the disclosure refers to and includes one or any or all possible combinations of multiple associated items that are listed.

Reference throughout this specification to "one embodiment," "an embodiment," "an example," "some embodiments," "some examples," or similar language means that a particular feature, structure, or characteristic described is included in at least one embodiment or example. Features, structures, elements, or characteristics described in connection with one or some embodiments are also applicable to other embodiments, unless expressly specified otherwise.

It should be understood that although the terms first, second, third, etc. may be used in the disclosure to describe various information, such information should not be limited to these terms. These terms are only used to distinguish the same type of information from each other. For example, without departing from the scope of the disclosure, first information may also be called second information and, similarly, second information may also be called first information. For example, term "if" used here may be explained as "while" or "when" or "responsive to determining", which depends on the context.

Figure 1:
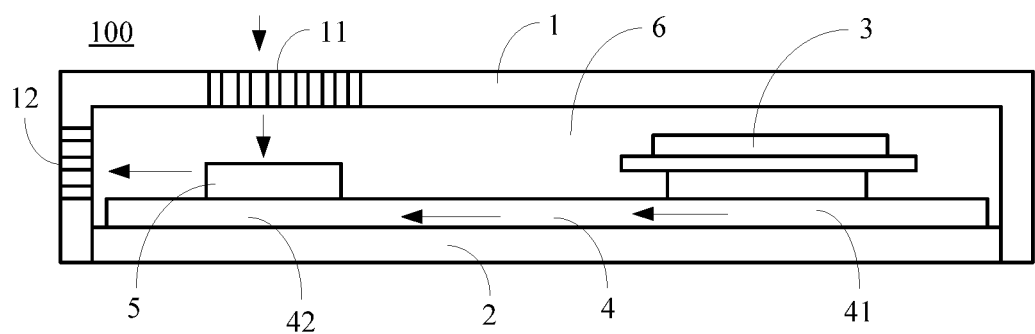
FIG. 1 is a schematic view of a partial cross section of electronic device according to an exemplary example.

FIG. 1 is a first schematic view of a partial cross section of an electronic device 100 according to an exemplary example. As shown in FIG. 1, the electronic device 100 may include a rear cover 1, a middle frame 2, a heat source component 3, a heat transfer assembly 4 and a fan 5. The rear cover 1 may include an air inlet 11 and an air outlet 12. The rear cover 1 may be assembled with the middle frame 2 to define a containing cavity 6. The containing cavity 6 may contain electronic elements of the electronic device 100, for example, the heat source component 3 may be arranged in the containing cavity 6. The heat source component 3 may include a mainboard and electronic elements arranged on the mainboard, such as a processor, a power management chip or other chips. For example, in the example according to FIG. 1, the heat source component may include a circuit board, a first element arranged on the side of the circuit board facing towards the middle frame of the circuit board, and a second element arranged on the side of the circuit board facing towards the rear cover. The heat transfer assembly 4 may be arranged on the side of the middle frame 2 facing towards the rear cover 1. The heat transfer assembly 4 and the middle frame 2 may be a stacked, for example, the heat transfer assembly 4 may be directly or indirectly connected to the surface of the middle frame 2 facing towards the rear cover 1. The heat transfer assembly 4 may include a first end 41 and a second end 42 which are arranged opposite to each other. The first end 41 and the heat source component 3 may be stacked in the thickness direction of the electronic device 100, and thus the heat of the heat source component 3 may be transferred to the second end 42 from the first end 41 through the heat transfer assembly 4. The fan 5 may be arranged opposite to the second end 42 in the containing cavity 6, and may draw air flow through the air inlet 11 and then discharge the air flow through the air outlet 12 during working, so as to increase the flow speed of the air flow in the containing cavity 6. In this way, the second end 42 of the heat transfer assembly 4 is actively cooled. The cooling efficiency can be improved and the cooling speed can be increased compared with the related art in which cooling is conducted by natural air flow.

Figure 2:
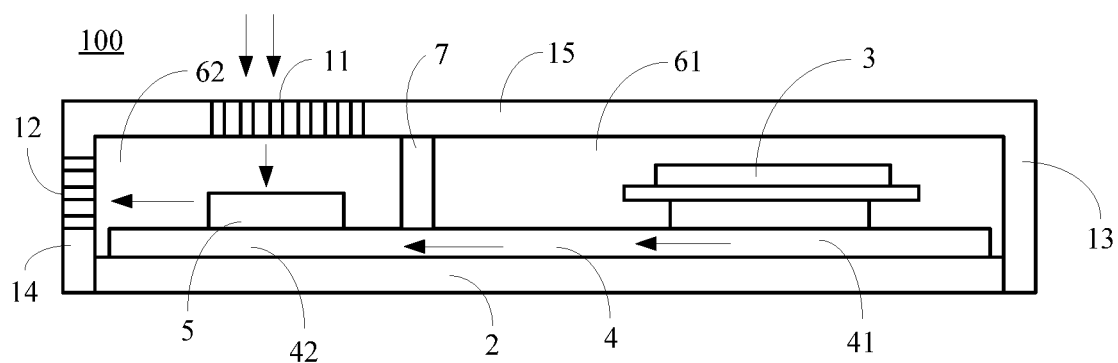
FIG. 2 is another schematic view of a partial cross section of electronic device according to an exemplary example.

In the example shown in FIG. 1, the air inlet 11 and the air outlet 12 are both in communication with the exterior of the electronic device 100, so that external dust or impurities may enter the electronic device 100 through the air inlet 11 and the air outlet 12. Hence, as shown in FIG. 2, the electronic device 100 may further include a partition rib 7 which may extend to a cover plate 15 from the middle frame 2 to divide the containing cavity 6 into a first cavity 61 and a second cavity 62. The heat source component 3 and the electronic elements of the electronic device 100 may be arranged in the first cavity 61, the fan 5 may be arranged in the second cavity 62, the air inlet 11 and the air outlet 12 may be both in communication with the second cavity 62, so that the heat of the heat source component 3 in the first cavity 61 may be transferred to the second end 42 from the first end 41 of the heat transfer assembly 4. Then cooling is conducted through the fan 5. Meanwhile, a partition can be achieved through the partition rib 7, the external impurities are prevented from contaminating the electronic elements in the first cavity 61, and dust protection for the electronic elements can be achieved.

In the example shown in FIG. 2, the rear cover 1 may include a first side frame 13, a second side frame 14 and the cover plate 15. The first side frame 13 may be connected to one side of the cover plate 15, the second side frame 14 may be connected to the other side opposite to the cover plate 15, the first side frame 13 may be adjacent to the first end 41 of the heat transfer assembly 4, and the second side frame may be adjacent to the second end of the heat transfer assembly 4. The partition rib 7 is located between the first side frame 13 and the second side frame 14. The first side frame 13 may be configured to define the first cavity 61, the second side frame 14 may be configured to define the second cavity 62, the air inlet 11 may be formed in an area of the cover plate 15 defining the second cavity 62, and the air outlet 12 may be formed in the second side frame 14.

As shown in FIG. 2, the air inlet 11 and the air outlet 12 may both be mesh holes. The air inlet 11 and the air outlet 12 may also be openings passing through the interior and the exterior of the electronic device 100 in other examples. Taking the example shown in FIG. 2 as an example, the air inlet 11 is located in the cover plate 15 and the air outlet 12 is located in the second side frame 14. Actually, in other examples where the electronic device 100 includes the partition rib 7 in the example of FIG. 2, the air inlet 11 may be arranged in the second side frame 14, and the air outlet 12 is located in the cover plate 15. In the example shown in FIG. 1, under the condition that the air inlet 11 and the air outlet 12 are located on different sides, the air inlet 11 may be located in the first side frame 13 or the second side frame 14 or the cover plate 15, the air outlet 12 may also be located in the first side frame 13 or the second side frame 14 or the cover plate 15, and the present disclosure makes no restrictions on this.

In each of the above examples, the heat transfer assembly 4 may include one or more of a vapor chamber, a heat pipe, a graphite flake and graphene. For example, the heat transfer assembly 4 may include an annular heat pipe, or a plurality of heat pipes arranged side-by-side, or a plurality of graphite flakes, or thick graphene, as long as the heat transfer assembly is designed for transferring heat from one end to the other end. For example, the heat transfer assembly 4 may include the vapor chamber which may be a flexible vapor chamber, the flexible vapor chamber can be bent towards one side of the heat source component to cover the outer side of the heat source component 3, whereby the flexible vapor chamber covers the heat source component 3 to enlarge the heat dissipation area for the heat source component 3 and improve the cooling efficiency. The vapor chamber may include a closed cavity and cooling liquid filling in the closed cavity. The cooling liquid may include at least one of formaldehyde, methyl alcohol and ethyl alcohol, or the cooling liquid may include the mixture of at least one of the formaldehyde, the methyl alcohol and the ethyl alcohol with water. Hereby, by adding one or more of the formaldehyde, the methyl alcohol and the ethyl alcohol in the cooling liquid, the boiling point of the cooling liquid can be lowered compared with the related art in which pure water is adopted. In this case, the boiling point of the cooling liquid may be further lowered after the closed cavity is vacuumized, so that the cooling liquid in the vapor chamber can be vaporized even at a low temperature, to conduct heat to the second end 42. For example, the boiling point of the cooling liquid under the atmosphere pressure can be adjusted to 20° C.-90° C. by adjusting the component proportion. The boiling point of the cooling liquid in the vapor chamber may be 10° C.-45° C. by further adjusting the vacuum degree of the closed cavity. The temperature for starting the phase change heat transfer of the vapor chamber of the electronic device 100 may be lowered. Active cooling may be still performed to improve the cooling efficiency when a user uses the electronic device 100 to operate a few programs. The fan 5 may include a turbofan or an axial fan, and can be designed according to actual needs, and the disclosure makes no restrictions on this.

The followings are detailed descriptions to the technology of the disclosure on the basis of the example shown in FIG. 2. Actually, what needs to be known is that the structure disclosed in the following example may be also applied to the example shown in FIG. 1, and the disclosure makes no restrictions on this.

Figure 3:
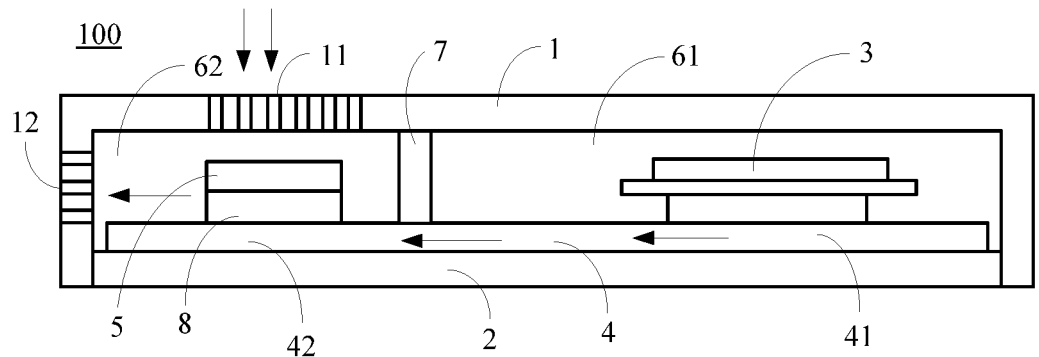
FIG. 3 is another schematic view of a partial cross section of electronic device according to an exemplary example.

As shown in FIG. 3, the electronic device 100 may further include a heat sink 8, the heat sink 8 may be arranged in the second cavity 62 and may be connected to the second end 42 of the heat transfer assembly 4 so as to cool the second end 42 of the heat transfer assembly 4 through the heat sink 8. Meanwhile, the flow speed of the air flow in the second cavity 62 can be increased through the fan 5 in the second cavity 62, so that a heat diffusion end of the heat sink is cooled, and the cooling efficiency can be further improved. The heat sink 8 may include a fin, for example, may include a copper fin or a stainless steel fin. The heat sink 8 may be welded or bonded or clamped to the second end 42 of the heat transfer assembly 4, and the disclosure makes no restrictions on this.

Figure 4:
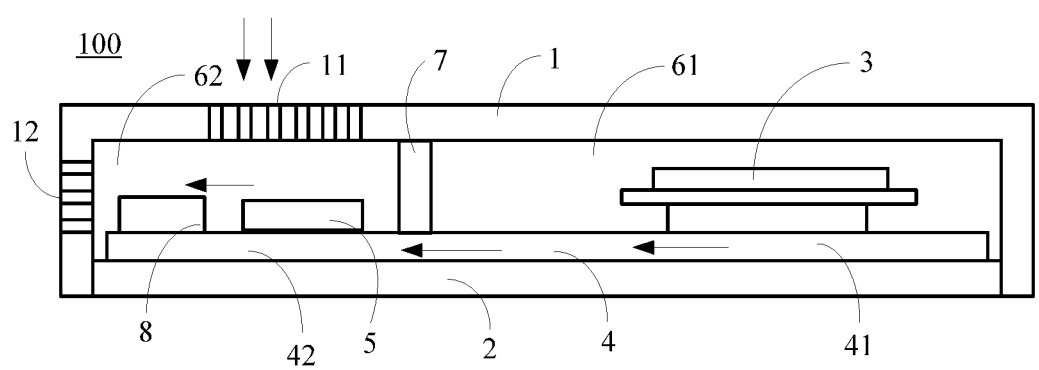
FIG. 4 is another schematic view of a partial cross section of electronic device according to an exemplary example.

In one example, also shown in FIG. 3, the fan 5 may be arranged above the heat sink 8 in the thickness direction of the electronic device 100, so that heat generated by the heat source component 3 may be transferred to the second end 42 in the direction from the first end 41 of the heat transfer assembly 4 to the second end 42. Then the heat is transferred to the heat sink 8, the air flow drawn by the fan 5 through the air inlet 11 allows a heat exchange, and then the hot air is charged from the air outlet 12. In another example, the heat sink 8 and the fan 5 may be arranged side by side at the second end 42 of the heat transfer assembly 4. For example, in an example shown in FIG. 4, the heat sink 8 and the fan 5 are arranged side by side, and the heat sink 8 is closer to the air outlet 12 than the fan 5. As such, the air flow entering from the air inlet 11 may be blown to the heat sink 8 after flowing through the fan 5, and then heat is taken away from the electronic device 100. Compared with the technical solution of FIG. 3, the fan 5 blows the air flow directly to the heat sink 8, so that the cooling efficiency can be improved. In addition, the thickness requirement to electronics can be lowered since the heat sink 8 and the fan 5 are arranged side by side, which is in favor of achieving a thin and light electronic device 100. Compared with the technical solution of FIG. 4, in the technical solution of FIG. 3, the fan 5 and the heat sink 8 are arranged in a stack so as to lower a longitudinal size requirement for the first cavity 61, which is beneficial to have a larger second cavity 62 and facilitate layout of the electronic elements in the second cavity 62. In the example shown in FIG. 4, the heat sink 8 may also be arranged farther away from the air outlet 12 than the fan 5; or in the orientation shown in FIG. 4, the heat sink 8 may also be arranged in the front or back of the fan 5, and the disclosure makes no restrictions on this.

Figure 5:
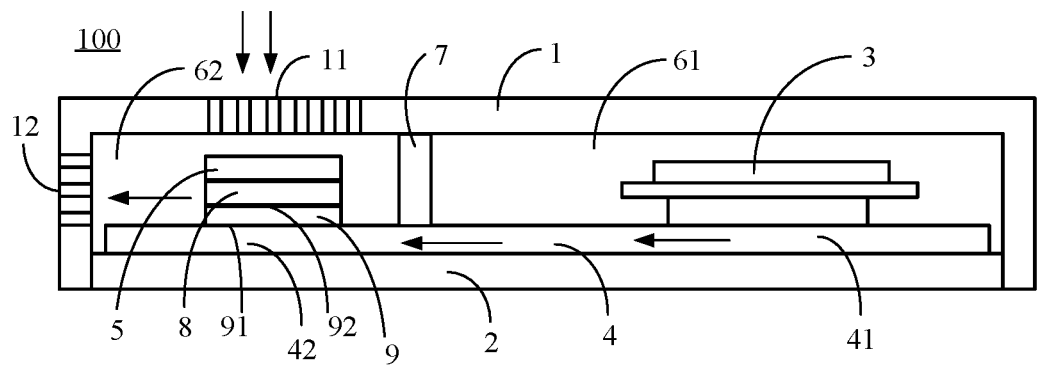
FIG. 5 is another schematic view of a partial cross section of electronic device according to an exemplary example.

Further, as shown in FIG. 5, the electronic device 100 may further include a second cooling fin 9. When the second cooling fin 9 is energized, the side of the second cooling fin 9 with a lower temperature forms a second heat absorption face 91, and the side of the second cooling fin with a higher temperature forms a second heat diffusion face 92. The second heat absorption face 91 of the second cooling fin 9 is in contact with the heat transfer assembly 4 and may actively absorb heat of the second end 42, and then the heat of the second end 42 is transferred to the first heat diffusion face 92. The second heat diffusion face 92 is in contact with the heat sink 8, so that the second heat diffusion face 92 may be cooled through the heat sink 8 so as to rapidly cool the second end 42 of the heat transfer assembly 4. In this way, heat of the first end 41 is also rapidly reduced to cool the heat source component 3. It should be noted that, in the example shown in FIG. 5, the second cooling fin 9 is provided on the basis of the example shown in FIG. 3 to actively absorb the heat of the heat source component 3. Actually, the example shown in FIG. 4 also may include the second cooling fin 9, with the second heat absorption face 91 of the second cooling fin 9 is in contact with the second end 42 of the heat transfer assembly 4, and the second heat diffusion face 92 is in contact with the heat sink 8. When the heat sink 8 is added into the example shown in FIG. 1, the second cooling fin 9 also may be arranged between the heat transfer assembly 4 and the heat sink 8, and will not be further described herein.

Figure 6:
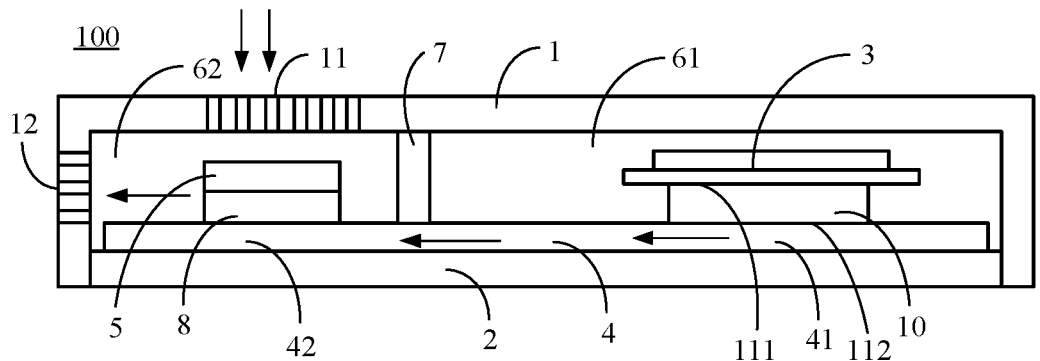
FIG. 6 is another schematic view of a partial cross section of electronic device according to an exemplary example.

As shown in FIG. 6, the electronic device 100 may further include a first cooling fin 10. When the first cooling fin is energized, a side with a lower temperature and a side with a higher temperature can be formed. The side with the lower temperature forms a first heat absorption face 111 of the first cooling fin 10, and the side with the higher temperature forms a first heat diffusion face 112. In the example shown in FIG. 6, the first heat absorption face 111 may be in contact with the heat source component 3, the first heat diffusion face 112 may be in contact with the heat transfer assembly 4. Thus, the heat source component 3 may be rapidly cooled through the first heat absorption face 111, and heat may be transferred to the heat transfer assembly 4 through the first heat diffusion face 112 and then transferred to the first end 41 of the heat transfer assembly 4. Hereby, the heat source component 3 can be actively cooled through the first cooling fin 10, as one side of the first cooling fin with the lower temperature is rapidly formed to absorb the heat of the heat source component 3. Thanks to such arrangement, the cooling efficiency is improved. It should be noted that the electronic device 100 on the basis of the example shown in FIG. 3 may further include the first cooling fin 10. Actually, in other examples, for example, in the examples shown in FIG. 1, FIG. 2, FIG. 4 and FIG. 5 and variants thereof, the first cooling fin 10 may also be arranged, and it will be not further described here.

Figure 7:
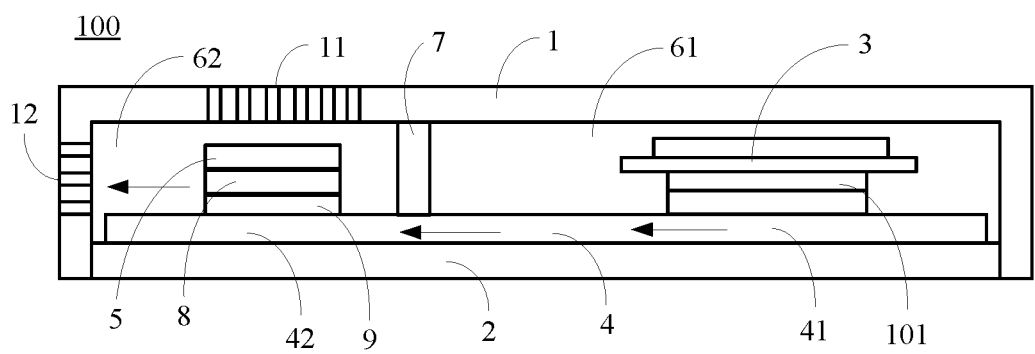
FIG. 7 is another schematic view of a partial cross section of electronic device according to an exemplary example.

As shown in FIG. 7, the electronic device 100 may further include a heat conduction pad 101 which may be arranged between the heat source component 3 and the heat transfer assembly 4. For example, in the example shown in FIG. 7, one side of the heat conduction pad 101 may be in contact with the heat source component 3 and the other side may be in contact with the heat transfer assembly 4 so as to transfer or store the heat of the heat source component 3 through the heat conduction pad 101. In this way, the decrease in cooling efficiency caused by untimely cooling of the heat transfer assembly 4 can be avoided. The heat conduction pad 101 may include heat conduction adhesive or heat conduction grease, which can be designed according to actual needs, and the disclosure makes no restrictions on this. It should be noted that the electronic device 100 on the basis of the example shown in FIG. 4 may further include the heat conduction pad 101. Actually, in other examples, such as any examples shown in FIG. 1 to FIG. 3 or in FIG. 5 to FIG. 6 and variants thereof, the electronic device 100 may also include the heat conduction pad 101. Particularly, for the example of the FIG. 6, the heat conduction pad 101 may be arranged between the first cooling fin 10 and the heat transfer assembly 4.

Figure 8:
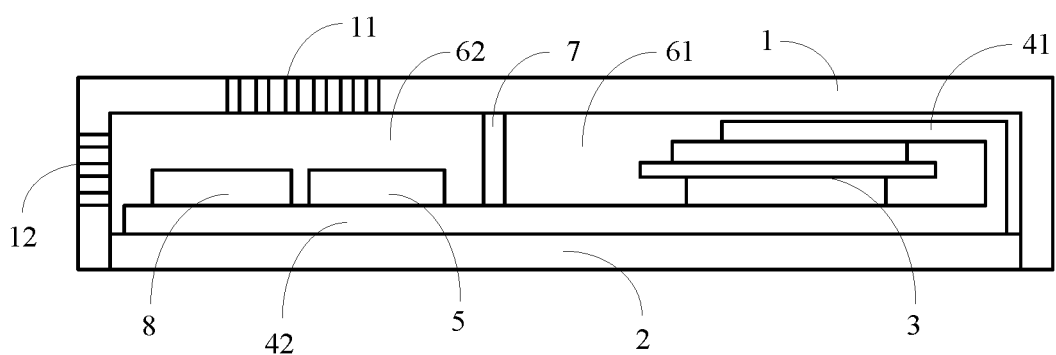
FIG. 8 is another schematic view of a partial cross section of electronic device according to an exemplary example.

In an example shown as FIG. 8, the first end 41 of the heat transfer assembly 4 may be bent towards the rear cover 1 from an area adjacent to the middle frame 2 so as to cover the side of the heat source component 3 away from the middle frame 2. Hence, on one hand, the side of the heat source component 3 facing towards the middle frame 2 is cooled through the side of the first end 41 of the heat transfer assembly 4 adjacent to the middle frame 2, and on the other hand, the side of the heat source component 3 facing towards the rear cover 1 is cooled through the side of the first end 41 adjacent to the rear cover 1. Thus, a circuit board with two opposite sides both provided with electronic elements can be rapidly cooled, and the application scenes of the present disclosure are broadened, and cooling is accelerated. In the example shown in FIG. 8, the shape and structure of the heat transfer assembly 4 are further limited on the basis of the example of FIG. 4. Actually, in the examples of FIG. 1 to FIG. 3 and of FIG. 5 to FIG. 7 and variants thereof, the first end 41 of the heat transfer assembly 4 may also be bent towards the rear cover 1 from the area adjacent to the middle frame 2 to cover the heat source component 3, and it will be not further described herein.

Other examples of the present disclosure will be apparent to those skilled in the art from consideration of the specification and practice of the disclosure here. The disclosure is intended to cover any variations, uses, or adaptations of the disclosure following the general principles thereof and including such departures from the disclosure as come within known or customary practice in the art. It is intended that the specification and examples be considered as exemplary only, with a true scope and spirit of the disclosure being indicated by the following claims.

It should be understood that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. An electronic device, comprising:
   a rear cover, comprising an air inlet and an air outlet;
   a middle frame, assembled with the rear cover to define a containing cavity, wherein the containing cavity is in communication with the air inlet and the air outlet;
   a heat source, disposed in the containing cavity;
   a heat transfer assembly, disposed on a side of the middle frame facing towards the rear cover, and comprising a first end and a second end, wherein the first end and the heat source are stacked in a thickness direction of the electronic device, and the heat transfer assembly is configured to transfer heat of the heat source to the second end;
   a fan, disposed opposite to the second end in the containing cavity, wherein the fan is configured to draw an air flow through the air inlet and discharge the air flow through the air outlet; and
   a partition rib that extends from the middle frame to the rear cover to divide the containing cavity into a first cavity and a second cavity, wherein the heat source is disposed in the first cavity, the fan is disposed in the second cavity, and the air inlet and the air outlet both are in communication with the second cavity,
   a first cooling fin comprising a first heat absorption face and a first heat diffusion face, wherein the first heat absorption face is in contact with the heat source, and the first heat diffusion face is in contact with the heat transfer assembly.

2. The electronic device according to claim 1, wherein the rear cover comprises a first side frame, a second side frame and a cover plate connected with the first side frame and the second side frame, the first side frame is adjacent to the first end, and the second side frame is adjacent to the second end;
   the partition rib is located between the first side frame and the second side frame, the first side frame is configured to define the first cavity, the second side frame is configured to define the second cavity, one of the air inlet and the air outlet is arranged on the second side frame, and the other one is arranged in an area of the cover plate defining the second cavity.

3. The electronic device according to claim 1, wherein the first end is bent towards the rear cover from an area adjacent to the middle frame, to cover a side of the heat source, wherein the side of the heat source covered is away from the middle frame.

4. The electronic device according to claim 1, further comprising a heat sink disposed in the containing cavity and connected to the second end of the heat transfer assembly.

5. The electronic device according to claim 4, wherein the fan is arranged above the heat sink in the thickness direction of the electronic device.

6. The electronic device according to claim 4, wherein the fan and the heat sink are disposed side by side at the second end of the heat transfer assembly.

7. The electronic device according to claim 6, wherein the heat sink is arranged to be closer to the air outlet than the fan.

8. The electronic device according to claim 4, further comprising:
   a second cooling fin comprising a second heat absorption face and a second heat diffusion face, wherein the second heat absorption face is in contact with the second end of the heat transfer assembly, and the second heat diffusion face faces towards the heat sink.

9. The electronic device according to claim 1, further comprising a heat conduction pad disposed between the heat source and the heat transfer assembly.

10. The electronic device according to claim 1, wherein the heat transfer assembly comprises at least one of a vapor chamber, a heat pipe, a graphite flake, or graphene.

11. The electronic device according to claim 1, wherein the heat transfer assembly comprises a vapor chamber, the vapor chamber comprises a closed cavity and cooling liquid arranged in the closed cavity,
    the cooling liquid comprises at least one of formaldehyde, methyl alcohol, or ethyl alcohol; or
    the cooling liquid comprises a mixture of at least one of the formaldehyde, the methyl alcohol, or the ethyl alcohol with water.

12. The electronic device according to claim 11, wherein a boiling point of the cooling liquid at atmosphere pressure is 20° C. to 90° C.

13. The electronic device according to claim 11, wherein the vapor chamber comprises a flexible vapor chamber, and wherein the flexible vapor chamber is bent towards one side of the heat source to cover an outside of the heat source.

14. The electronic device according to claim 1, wherein the heat transfer assembly is connected to a surface of the middle frame, the surface of the middle frame facing towards the rear cover.

15. The electronic device according to claim 1, wherein each of the air inlet and the air outlet is a mesh hole, or each of the air inlet and the air outlet is an opening passing through an interior and an exterior of the electronic device.

16. The electronic device according to claim 1, further comprising a heat conduction pad disposed between the heat source and the first cooling fin.

17. The electronic device according to claim 1, wherein the heat transfer assembly comprises an annular heat pipe, or a plurality of heat pipes arranged side-by-side.

18. The electronic device according to claim 9, wherein the heat conduction pad comprises heat conduction adhesive or heat conduction grease.

* * * * *